US012560657B2

(12) United States Patent
Liu et al.

(10) Patent No.: US 12,560,657 B2
(45) Date of Patent: Feb. 24, 2026

(54) BATTERY STATE OF HEALTH ESTIMATION METHOD, BATTERY MANAGEMENT APPARATUS, AND BATTERY MANAGEMENT SYSTEM

(71) Applicant: Shenzhen Yinwang Intelligent Technologies Co., Ltd., Shenzhen (CN)

(72) Inventors: Yadan Liu, Xi'an (CN); Liliang Liu, Shanghai (CN); Baojin Fang, Suzhou (CN); Xiunan Lu, Shanghai (CN)

(73) Assignee: SHENZHEN YINWANG INTELLIGENT TECHNOLOGIES CO., LTD., Shenzhen (CN)

( * ) Notice: Subject to any disclaimer, the term of this patent is extended or adjusted under 35 U.S.C. 154(b) by 584 days.

(21) Appl. No.: 17/952,492

(22) Filed: Sep. 26, 2022

(65) Prior Publication Data

US 2023/0015227 A1     Jan. 19, 2023

Related U.S. Application Data

(63) Continuation of application No. PCT/CN2020/081667, filed on Mar. 27, 2020.

(51) Int. Cl.
*G01R 31/392* (2019.01)
*G01R 31/367* (2019.01)
*G01R 31/388* (2019.01)

(52) U.S. Cl.
CPC ......... *G01R 31/392* (2019.01); *G01R 31/367* (2019.01); *G01R 31/388* (2019.01)

(58) Field of Classification Search
None
See application file for complete search history.

(56) References Cited

U.S. PATENT DOCUMENTS

| | | | |
|---|---|---|---|
| 2011/0234166 A1 | 9/2011 | Liu | |
| 2015/0061601 A1* | 3/2015 | Hatanaka | G01R 31/382 |
| | | | 320/136 |
| 2015/0070024 A1* | 3/2015 | Kim | G01R 31/392 |
| | | | 324/430 |

(Continued)

FOREIGN PATENT DOCUMENTS

| | | |
|---|---|---|
| CN | 102445663 A | 5/2012 |
| CN | 103267950 A | 8/2013 |
| CN | 103823188 A | 5/2014 |

(Continued)

OTHER PUBLICATIONS

Zhang Liqiang, "Electric vehicle charging technology," Tianjin University Press, Apr. 2019, with an English abstract, 10 pages.

(Continued)

*Primary Examiner* — Raymond L Nimox
(74) *Attorney, Agent, or Firm* — Conley Rose, P.C.

(57) ABSTRACT

A battery state of health estimation method, where an aging state of any one or more battery cells in a battery pack can be estimated. The method may be applied to an intelligent vehicle, a new energy vehicle, and a connected vehicle. When the battery pack is unavailable, an aging state of each battery cell is estimated by using the solution provided in the present disclosure. An obtained estimation result can provide a recycling guide for the battery cell to improve secondary utilization of the battery cell in the battery pack.

20 Claims, 4 Drawing Sheets

(56) References Cited

U.S. PATENT DOCUMENTS

2018/0088181 A1    3/2018    Jiang et al.

FOREIGN PATENT DOCUMENTS

| | | | |
|---|---|---|---|
| CN | 105140996 A | | 12/2015 |
| CN | 105301509 A | * | 2/2016 |
| CN | 103823188 B | * | 6/2016 |
| CN | 106324508 A | | 1/2017 |
| CN | 107807333 A | | 3/2018 |
| CN | 207218279 U | | 4/2018 |
| CN | 108508371 A | | 9/2018 |
| CN | 108550928 A | | 9/2018 |
| CN | 108594123 A | | 9/2018 |
| CN | 108711648 A | * | 10/2018 |
| CN | 109507611 A | | 3/2019 |
| CN | 109606200 A | | 4/2019 |
| CN | 109633477 A | | 4/2019 |
| CN | 110286324 A | | 9/2019 |
| CN | 110614936 A | | 12/2019 |
| JP | 2019013109 A | | 1/2019 |

OTHER PUBLICATIONS

P. Ramadass et al., "Mathematical modeling of the capacity fade of Li-ion cells," Journal of Power Sources 123 (2003), 11 pages.

Yu Zhilong, "Rapid Prediction of Capacity of Li-Ion Battery and Design of Li-Ion Battery Integration Testing System," Harbin University of Science and Technology, 2008 Issue 01, with an English abstract, 70 pages.

Wang Qiuting et al., "Study on SOC/SOH Estimation Method and Capacity Attenuation Mechanism Based on D-UKF for Lithium-ion Battery," Bulletin of Science and Technology, vol. 34, No. 1, Jan. 2018, with an English abstract, 6 pages.

* cited by examiner

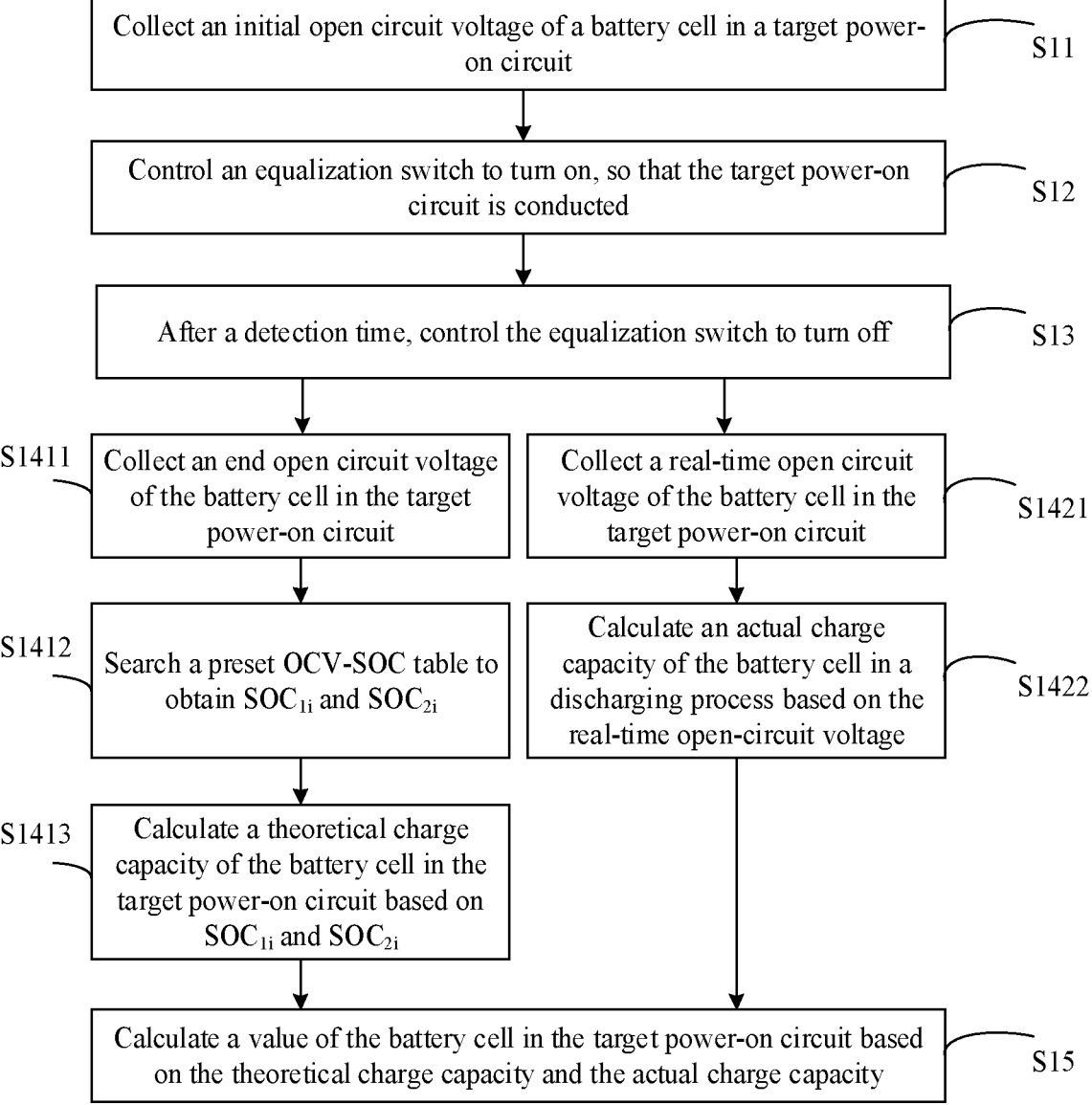

Collect an initial open circuit voltage of a battery cell in a target power-on circuit — S11

Control an equalization switch to turn on, so that the target power-on circuit is conducted — S12

After a detection time, control the equalization switch to turn off — S13

S1411 — Collect an end open circuit voltage of the battery cell in the target power-on circuit S1421 — Collect a real-time open circuit voltage of the battery cell in the target power-on circuit S1412 — Search a preset OCV-SOC table to obtain $SOC_{1i}$ and $SOC_{2i}$ S1422 — Calculate an actual charge capacity of the battery cell in a discharging process based on the real-time open-circuit voltage S1413 — Calculate a theoretical charge capacity of the battery cell in the target power-on circuit based on $SOC_{1i}$ and $SOC_{2i}$ Calculate a value of the battery cell in the target power-on circuit based on the theoretical charge capacity and the actual charge capacity — S15

FIG. 4

BATTERY STATE OF HEALTH ESTIMATION METHOD, BATTERY MANAGEMENT APPARATUS, AND BATTERY MANAGEMENT SYSTEM

CROSS-REFERENCE TO RELATED APPLICATIONS

This application is a continuation of International Patent Application No. PCT/CN2020/081667, filed on Mar. 27, 2020, the disclosure of which is hereby incorporated by reference in its entirety.

TECHNICAL FIELD

The present disclosure relates mainly to a battery state of health detection technology, and in particular, to a battery state of health estimation method, a battery management apparatus, and a battery management system.

BACKGROUND

Currently, driving energy of an electric vehicle mainly comes from a power battery. Because driving an electric vehicle requires high energy, the power battery is usually formed by connecting a plurality of battery cells in series. Usually, the power battery formed by connecting the plurality of battery cells in series is referred to as a battery pack.

The battery pack is inevitably aged in long-term use. Therefore, an aging state of the battery pack needs to be estimated. At present, a battery state of health (SOH) may be used to estimate an aging state of the battery pack. An estimation process is as follows: An actual charge or discharge charge capacity of the battery pack is calculated based on current integrals of the battery pack in a charging or discharging process; a theoretical charge or discharge charge capacity of the battery pack is calculated based on voltage integrals of the battery pack in the charging or discharging process; and an SOH of each battery cell is calculated based on the theoretical charge or discharge charge capacity of the battery pack and the actual charge or discharge charge capacity of the battery pack.

In the foregoing battery state of health estimation method, the SOH of each battery cell is calculated based on the theoretical charge or discharge charge capacity of the battery pack and the actual charge or discharge charge capacity of the battery pack. Consequently, every time the SOH is calculated, all battery cells in a same battery pack need to be charged or discharged, and charging or discharging of a single battery cell/some battery cells cannot be controlled to calculate an SOH of a controlled battery cell.

SUMMARY

Based on the foregoing technical problems, an objective of the present disclosure is to provide a battery state of health estimation method, a battery management apparatus, and a battery management system.

According to a first aspect, an embodiment of the present disclosure provides a battery state of health estimation method, including: obtaining a target power-on circuit, where the target power-on circuit is a power-on circuit formed by one battery cell in a battery pack and a load or a charging device, and the battery pack includes a plurality of battery cells; calculating a theoretical charge capacity and an actual charge capacity of the battery cell in the target power-on circuit in a charging process or a discharging process; and calculating an SOH of the battery cell in the target power-on circuit based on the theoretical charge capacity and the actual charge capacity.

In this implementation, an aging state of one battery cell in the battery pack can be estimated. When the battery pack is unavailable, an aging state of each battery cell in the battery pack is estimated by using the solution provided in the present disclosure. An obtained estimation result can provide a recycling guide for the battery cell in the battery pack, to improve secondary utilization of the battery cell in the battery pack.

With reference to the first aspect, in a first possible implementation of the first aspect, the target power-on circuit is an equalization circuit including the battery cell, an equalization resistor, and an equalization switch, and the battery cell, the equalization resistor, and the equalization switch are connected in series.

In this implementation, a state of health can be also estimated without an external device. This further improves applicability of the solution.

With reference to the first aspect, in a second possible implementation of the first aspect, the calculating a theoretical charge capacity of the battery cell in the target power-on circuit in a discharging process includes: collecting an initial open circuit voltage $V_{1i}$ of the battery cell in the target power-on circuit, where the initial open circuit voltage is an open circuit voltage before the equalization switch is turned on; controlling the equalization switch to turn on, so that the target power-on circuit is conducted; after a detection time, controlling the equalization switch to turn off; collecting an end open circuit voltage $V_{2i}$ of the battery cell in the target power-on circuit, where the end open circuit voltage is an open circuit voltage when the equalization switch is turned off; searching a preset OCV-SOC table to obtain $SOC_{1i}$ and $SOC_{2i}$, where $SOC_{1i}$ is a state of charge corresponding to a new battery when an open circuit voltage is the initial open circuit voltage $V_{1i}$, and $SOC_{2i}$ is a state of charge corresponding to the new battery when an open circuit voltage is the end open circuit voltage $V_{2i}$; and calculating the theoretical charge capacity of the battery cell in the target power-on circuit in the discharging process based on $SOC_{1i}$ and $SOC_{2i}$.

In this implementation, the theoretical charge capacity of the battery cell in the target power-on circuit in the discharging process can be calculated by searching a table. Compared with an integration operation processing manner shown in the conventional technology, this reduces a system calculation amount to some extent.

With reference to the first aspect, in a third possible implementation of the first aspect, the theoretical charge capacity $Q_i$ of the battery cell in the target power-on circuit in the discharging process is calculated based on the following formula: $Q_i=(SOC_{1i}-SOC_{2i})\times Q_{new}$, where $Q_{new}$ is a total charge capacity of the new battery, and a unit is C.

In this implementation, the theoretical charge capacity of the battery cell in the target power-on circuit in the discharging process is calculated. Compared with the integration operation processing manner shown in the conventional technology, this reduces the system calculation amount to some extent.

With reference to the first aspect, in a fourth possible implementation of the first aspect, the detection time is less than or equal to a time required by the battery cell in the target power-on circuit to be fully discharged from a fully charged state.

In this implementation, an estimation time can be shortened to some extent.

With reference to the first aspect, in a fifth possible implementation of the first aspect, the calculating an actual charge capacity of the battery cell in the target power-on circuit in a discharging process includes: performing an integral operation on the initial open circuit voltage and the end open circuit voltage, to obtain the actual charge capacity $Q_{dis\_i}$ of the battery cell in the target power-on circuit in the discharging process.

In this implementation, the actual charge capacity of the battery cell in the target power-on circuit can be calculated.

With reference to the first aspect, in a sixth possible implementation of the first aspect, the calculating an actual charge capacity of the battery cell in the target power-on circuit in a discharging process includes: collecting a real-time open circuit voltage of the battery cell in the target power-on circuit, where the real-time open circuit voltage is an open circuit voltage collected at a preset sampling frequency when the equalization switch is turned on; and calculating the actual charge capacity of the battery cell in the target power-on circuit in the discharging process based on the following formula:

$$Q_{dis_i} = \sum_{t=1}^{t=T\times60\times f} \frac{V_{i_t}^2}{R \times f}$$

In the formula, $Q_{dis\_i}$ is the actual charge capacity of the battery cell in the target power-on circuit in the discharging process, and a unit is C; T is a discharge time, and a unit is min; $V_{i\_t}$ is the real-time open circuit voltage, and a unit is V; R is a resistance value of the equalization resistor, and a unit is $\Omega$; and f is the preset sampling frequency, and a unit is Hz.

In this implementation, the actual charge capacity of the battery cell in the target power-on circuit in the discharging process can be calculated in a summing manner. Compared with the integration operation processing manner shown in the conventional technology, this reduces the system calculation amount to some extent.

With reference to the first aspect, in a seventh possible implementation of the first aspect, the SOH of the battery cell of the target power-on circuit is calculated based on the following formula:

$$SOH = k_i \times \frac{Q_{dis\_i}}{Q_i}$$

In the formula, $k_i$ is a mapping proportion coefficient, and $k_i$ is obtained by searching a preset $k_i$ table based on $V_{1i}$ and $V_{2i}$.

In this implementation, $k_i$ is introduced in a calculation process of the SOH, which can improve accuracy of an estimation result in this solution.

With reference to the first aspect, in an eighth possible implementation of the first aspect, the preset OCV-SOC table is used to record a correspondence between an open circuit voltage and a state of charge, and the preset $k_i$ table is used to record a correspondence between an open circuit voltage and a mapping proportion coefficient.

In this implementation, the table recording the correspondence between an open circuit voltage and a state of charge and the table recording the correspondence between an open circuit voltage and a mapping proportion coefficient can be invoked based on a requirement.

With reference to the first aspect, in a ninth possible implementation of the first aspect, in a process in which the target power-on circuit is conducted, the battery cell is discharged at a small current.

In this implementation, small current discharge can appropriately prolong a discharge time of the battery cell in the target power-on circuit. This can avoid, to some extent, a damage to the battery cell in the target power-on circuit caused by a rapid drop of the open circuit voltage of the battery cell in the target power-on circuit to below a cut-off discharge voltage.

According to a second aspect, an embodiment of the present disclosure provides a battery management apparatus, including: an obtaining module configured to obtain a target power-on circuit, where the target power-on circuit is a power-on circuit formed by one battery cell in a battery pack and a load or a charging device, and the battery pack includes a plurality of battery cells; and a generation module configured to calculate a theoretical charge capacity and an actual charge capacity of the battery cell in the target power-on circuit in a charging process or a discharging process, and further configured to calculate an SOH of the battery cell in the target power-on circuit based on the theoretical charge capacity and the actual charge capacity.

In this implementation, an aging state of the battery cell in the battery pack can be estimated. When the battery pack is unavailable, an aging state of each battery cell in the battery pack is estimated by using the solution provided in the present disclosure. An obtained estimation result can provide a recycling guide for the battery cell in the battery pack, to improve secondary utilization of the battery cell in the battery pack.

With reference to the second aspect, in a first possible implementation of the second aspect, the target power-on circuit is an equalization circuit, and is formed by connecting the battery cell, an equalization resistor, and an equalization switch in series.

In this implementation, a state of health can be also estimated without an external device. This further improves applicability of the solution.

With reference to the second aspect, in a second possible implementation of the second aspect, the obtaining module includes a collection submodule and a control submodule, and the generation module includes a collection submodule and a data processing submodule. The collection submodule is configured to collect an initial open circuit voltage of the battery cell in the target power-on circuit, where the initial open circuit voltage is an open circuit voltage $V_{1i}$ before the equalization switch is turned on. The control submodule is configured to control the equalization switch to turn on, so that the target power-on circuit is conducted; and after a detection time, the control submodule is further configured to control the equalization switch to turn off. The collection submodule is further configured to collect an end open circuit voltage $V_{2i}$ of the battery cell in the target power-on circuit, where the end open circuit voltage is an open circuit voltage when the equalization switch is turned off. The data processing submodule is configured to search a preset OCV-SOC table to obtain $SOC_{1i}$ and $SOC_{2i}$, where $SOC_{1i}$ is a state of charge corresponding to a new battery when an open circuit voltage is the initial open circuit voltage $V_{1i}$, and $SOC_{2i}$ is a state of charge corresponding to the new battery when an open circuit voltage is the end open circuit voltage $V_{2i}$; and the data processing submodule is further configured to calculate the theoretical charge capacity of the battery cell in the target power-on circuit in the discharging process based on $SOC_{1i}$ and $SOC_{2i}$.

In this implementation, the theoretical charge capacity of the battery cell in the target power-on circuit in the discharging process can be calculated by searching a table. Compared with an integration operation processing manner shown in the conventional technology, this reduces a system calculation amount to some extent.

With reference to the second aspect, in a third possible implementation of the second aspect, the data processing submodule is further configured to calculate the theoretical charge capacity $Q_i$ of the battery cell in the target power-on circuit in the discharging process based on the following formula: $Q_i=(SOC_{1i}-SOC_{2i})\times Q_{new}$, where $Q_{new}$ is a total charge capacity of the new battery, and a unit is C.

In this implementation, the theoretical charge capacity of the battery cell in the target power-on circuit in the discharging process is calculated. Compared with the integration operation processing manner shown in the conventional technology, this reduces the system calculation amount to some extent.

With reference to the second aspect, in a fourth possible implementation of the second aspect, the detection time is less than or equal to a time required by the battery cell in the target power-on circuit to be fully discharged from a fully charged state.

In this implementation, an estimation time can be shortened to some extent.

With reference to the second aspect, in a fifth possible implementation of the second aspect, the data processing submodule is further configured to perform an integral operation on the initial open circuit voltage and the end open circuit voltage to obtain the actual charge capacity $Q_{dis\_i}$ of the battery cell in the target power-on circuit in the discharging process.

In this implementation, the actual charge capacity of the battery cell in the target power-on circuit can be calculated.

With reference to the second aspect, in a sixth possible implementation of the second aspect, the collection submodule is further configured to collect a real-time open circuit voltage of the battery cell in the target power-on circuit, where the real-time open circuit voltage is an open circuit voltage collected at a preset sampling frequency when the equalization switch is turned on; and the data processing submodule is further configured to calculate the actual charge capacity $Q_{dis\_i}$ of the battery cell in the target power-on circuit in the discharging process based on the following formula:

$$Q_{dis\_i} = \sum_{t=1}^{t=T\times 60\times f} \frac{V_{i\_t}^2}{R\times f}$$

In the formula, $Q_{dis\_i}$ is the actual charge capacity of the battery cell in the target power-on circuit in the discharging process, and a unit is C; T is a discharge time, and a unit is min; $V_{i\_t}$ is the real-time open circuit voltage, and a unit is V; R is a resistance value of the equalization resistor, and a unit is $\Omega$; and f is the preset sampling frequency, and a unit is Hz.

In this implementation, the actual charge capacity of the battery cell in the target power-on circuit in the discharging process can be calculated in a summing manner. Compared with the integration operation processing manner shown in the conventional technology, this reduces the system calculation amount to some extent.

With reference to the second aspect, in a seventh possible implementation of the second aspect, the data processing submodule is further configured to calculate the SOH of the battery cell of the target power-on circuit based on the following formula:

$$SOH = k_i \times \frac{Q_{dis\_i}}{Q_i}$$

In the formula, $k_i$ is a mapping proportion coefficient, and $k_i$ is obtained by searching a preset $k_i$ table based on $V_{1i}$ and $V_{2i}$.

In this implementation, $k_i$ is introduced in a calculation process of the SOH, which can improve accuracy of an estimation result in this solution.

With reference to the second aspect, in an eighth possible implementation of the second aspect, the preset OCV-SOC table is used to record a correspondence between an open circuit voltage and a state of charge, and the preset $k_i$ table is used to record a correspondence between an open circuit voltage and a mapping proportion coefficient.

In this implementation, the table recording the correspondence between an open circuit voltage and a state of charge and the table recording the correspondence between an open circuit voltage and a mapping proportion coefficient can be invoked based on a requirement.

With reference to the second aspect, in a ninth possible implementation of the second aspect, in a process in which the target power-on circuit is conducted, the battery cell is discharged at a small current.

In this implementation, small current discharge can appropriately prolong an open circuit voltage discharge time of the battery cell in the target power-on circuit. This can avoid, to some extent, a damage to the battery cell in the target power-on circuit caused by a rapid drop of the open circuit voltage of the battery cell in the target power-on circuit to below a cut-off discharge voltage.

According to a third aspect, an embodiment of the present disclosure provides a battery management system, including: a battery control apparatus configured to receive a control instruction sent by a host, and send, in response to the control instruction that is a detection instruction, the detection instruction to a battery management apparatus; and the battery management apparatus configured to obtain a target power-on circuit in response to the received detection instruction, where the target power-on circuit is a power-on circuit formed by one battery cell in a battery pack and a load or a charging device, and the battery pack includes a plurality of battery cells, the battery management apparatus is further configured to calculate a theoretical charge capacity and an actual charge capacity of the battery cell in the target power-on circuit in a charging process or a discharging process; and the battery management apparatus is further configured to calculate an SOH of the battery cell in the target power-on circuit based on the theoretical charge capacity and the actual charge capacity.

In this implementation, an aging state of the battery cell in the battery pack can be estimated. When the battery pack is unavailable, an aging state of each battery cell in the battery pack is estimated by using the solution provided in the present disclosure. An obtained estimation result can provide a recycling guide for the battery cell in the battery pack, to improve secondary utilization of the battery cell in the battery pack.

BRIEF DESCRIPTION OF DRAWINGS

To describe the technical solutions in the present disclosure more clearly, the following briefly describes the accompanying drawings for describing embodiments. It is clear that a person of ordinary skill in the art may derive other drawings from these accompanying drawings without creative efforts.

FIG. 4 is a schematic flowchart of a battery state of health estimation method according to an embodiment of the present disclosure.

DESCRIPTION OF EMBODIMENTS

The following describes some of the foregoing technical terms and subsequent technical terms to help understand the present disclosure.

A battery cell SOC indicates a ratio of a remaining capacity of a battery cell to a capacity of the battery cell in a fully charged state.

A battery SOH indicates a ratio of a capacity of a battery in a fully charged state after aging to an initial capacity of the battery at delivery.

Battery aging indicates battery performance attenuation after a battery is used for a period of time or is not used for a long time.

An open circuit voltage (OCV) indicates a terminal voltage of a battery in an open circuit state.

Various technical solutions are proposed in various embodiments in this specification to estimate a state of health of a battery cell in a battery pack.

To make the foregoing objectives, technical solutions, and advantages of the present disclosure easier to understand, the following provides detailed descriptions. The detailed descriptions provide various embodiments of a device and/or a process by using block diagrams, flowcharts, and/or examples. These block diagrams, flowcharts, and/or examples include one or more functions and/or operations, so a person in the art may understand that each function and/or operation in the block diagrams, the flowcharts, and/or the examples may be performed independently and/or jointly by using much hardware, software, and firmware, and/or any combination thereof.

Embodiment 1

Figures 1, 2:
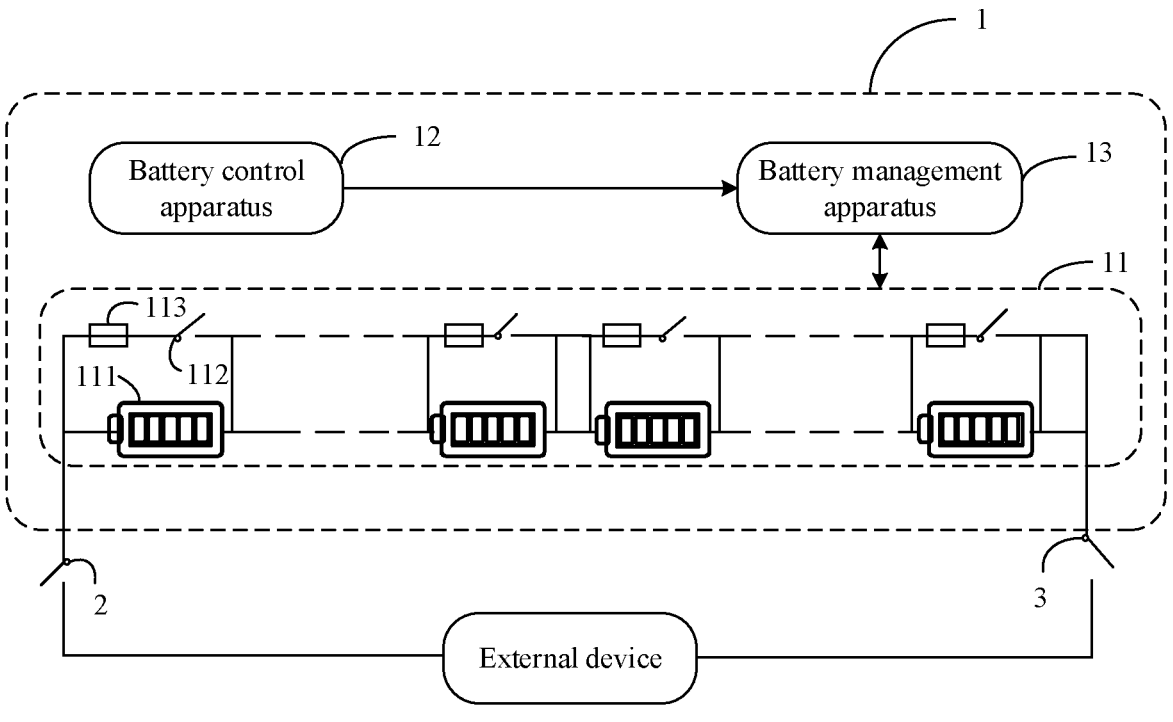
FIG. 1 is a schematic diagram of a structure of a battery management system according to the present disclosure.
FIG. 2 is a schematic diagram of a structure of a battery management apparatus according to an embodiment of the present disclosure.

The following describes a battery management system shown in an embodiment of the present disclosure with reference to an accompanying drawing. FIG. 1 is a schematic diagram of a structure of a battery management system according to an embodiment. It may be learned that the battery management system 1 includes a battery pack 11, a battery control apparatus 12, and a battery management apparatus 13.

The battery pack 11 includes at least one battery cell 111. In the present disclosure, the battery cell 111 is a lithium-ion battery. Each battery cell 111 inside the battery pack 11 forms an equalization circuit with an equalization resistor 112 and an equalization switch 113. A positive electrode of the battery pack 11 is connected to a main positive relay 2, and a negative electrode of the battery pack is connected to a main negative relay 3.

The battery control apparatus 12 may be configured to receive a control instruction output by a host (not shown in the figure). The control instruction may be an equalization instruction, a charging instruction, a discharging instruction, a detection instruction, or the like. The battery control apparatus 12 may be further configured to implement corresponding functions based on different control instructions.

For example, in response to a received control instruction that is a charging instruction, the battery control apparatus 12 controls the main positive relay 2 and the main negative relay 3 to turn on, so that the battery pack is connected to a charging device. A type of the charging device in the present disclosure is not specifically limited, and the type of the charging device may be a portable charging gun, or may be a desktop charger.

In another example, in response to a received control instruction that is a discharging instruction, the battery control apparatus 12 controls the main positive relay 2 and the main negative relay 3 to turn on, so that the battery is connected to a load. A type of the load in the present disclosure is not specifically limited, and any load whose load voltage is 300 V to 800 V may be used in the present disclosure.

In another example, in response to a received control instruction that is a detection instruction, the battery control apparatus 12 sends the detection instruction to the battery management apparatus 13. The detection instruction carries a serial number of a to-be-detected battery cell. This enables the battery management apparatus 13 to determine a target power-on circuit based on the serial number of the to-be-detected battery cell.

FIG. 2 is a schematic diagram of a structure of a battery management apparatus 13 according to an embodiment. It may be learned that the battery management apparatus 13 includes an obtaining module 131, a generation module 132, and a memory 133.

The obtaining module 131 may be configured to obtain a target power-on circuit. The target power-on circuit is a power-on circuit formed by one battery cell in a battery pack and a load or a charging device. In the present disclosure, the target power-on circuit may be one or more power-on circuits.

For example, usually, each battery cell in the battery pack has a corresponding serial number list, list=(1, 2, . . . , N), where N is a total quantity of battery cells. A battery cell of which an SOH needs to be calculated is a battery cell in the target power-on circuit. If an SOH of each of a third battery cell and a $17^{th}$ battery cell needs to be calculated, i=(3, 17). If the SOH of the third battery cell needs to be calculated, i=(3).

Still refer to FIG. 2. The obtaining module 131 may include a read submodule 1311 and a control submodule 1312.

The read submodule 1311 may be configured to read a battery cell serial number carried in a detection instruction, and store the battery cell serial number in the memory 133. The read submodule 1311 may be further configured to read a detection time carried in the detection instruction, and store the detection time in the memory 133.

The control submodule 1312 may be configured to invoke a battery cell serial number in the memory 133, and control a switch corresponding to the battery cell serial number to turn on, to enable a power-on circuit (that is, the target power-on circuit) in which a battery cell corresponding to the battery cell serial number is located to be conducted. The control submodule 1312 may be configured to invoke a detection time in the memory 133, and after the detection time, turn off a switch corresponding to a battery cell serial number.

The generation module 132 may be configured to calculate a theoretical charge capacity and an actual charge capacity of a battery cell in the target power-on circuit in a charging process or a discharging process, and may be further configured to calculate an SOH of the battery cell in the target power-on circuit based on the theoretical charge capacity and the actual charge capacity.

Still refer to FIG. 2. The generation module 132 may include a collection submodule 1321 and a data processing submodule 1322.

The collection submodule 1321 may be configured to collect a collection value of the battery cell 111 in the target power-on circuit, where the collection value may be an open circuit voltage or current, and configured to output the collected collection value to the data processing submodule 1322, so that the data processing submodule 1322 can calculate the theoretical charge capacity and the actual charge capacity of the battery cell in the target power-on circuit in the charging process or the discharging process based on the collection value.

The data processing submodule 1322 may be configured to receive the collection value output by the collection submodule 1321; may be further configured to read various types of information stored in the memory 133; and may further calculate the SOH of the battery cell in the target power-on circuit based on the collection value and the various types of information stored in the memory 133. The data processing submodule 1322 may further output the SOH of the battery obtained based on online detection to a display apparatus (not provided in the figure). The display apparatus is any apparatus that can visually display the SOH of the battery. For example, the display apparatus may be a liquid crystal display (LCD) or a light emitting diode (LED) display.

The memory 133 may be a common semiconductor component that can record and delete data, for example, a random access memory (RAM), a read-only memory (ROM), an electrically erasable programmable ROM (EEPROM), or a mass storage medium, for example, a hard disk.

Figure 3:
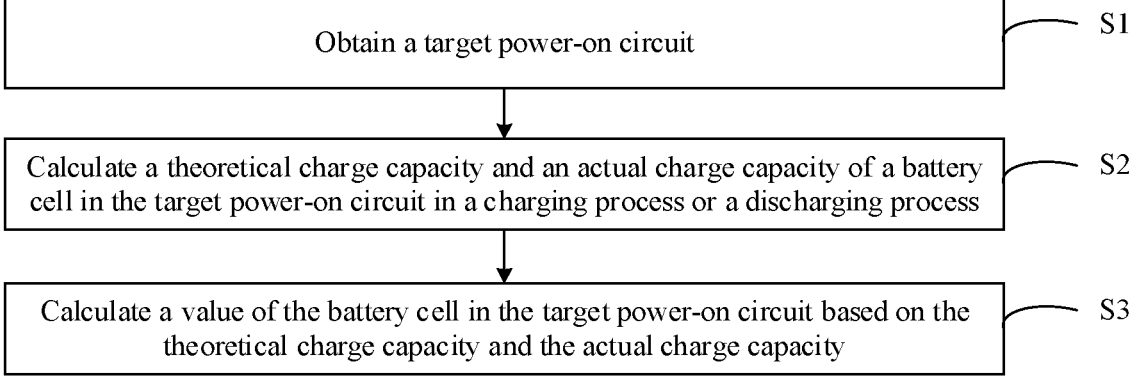
FIG. 3 is a schematic flowchart of a battery state of health estimation method according to an embodiment of the present disclosure.

With reference to FIG. 1 and FIG. 2, the following specifically describes how the management unit 13 estimates a state of health of a battery cell in a target power-on circuit. FIG. 3 is a flowchart of a battery state of health estimation method according to an embodiment.

Step S1: The obtaining module 131 obtains a target power-on circuit, where the target power-on circuit is a power-on circuit formed by one battery cell in a battery pack and a load or a charging device. The power-on circuit may be a discharge power-on circuit formed by the battery cell and the load, and the discharge power-on circuit is configured to implement a discharge function of the battery cell. The power-on circuit may alternatively be a charging power-on circuit formed by the battery cell and the charging device, and the power-on circuit is configured to implement a charging function of the battery cell.

An implementation of obtaining the target power-on circuit may be based on a user operation. For example, a user may connect a resistor to a battery cell in the battery pack in series, and a corresponding power-on circuit formed by the battery cell and the resistor is the target power-on circuit. An implementation of obtaining the target power-on circuit may alternatively be implemented in a manner in which a host sends a control instruction. For example, the obtaining module 131 receives a control instruction sent by the host that carries a battery cell serial number, and identifies the battery cell serial number in the control instruction. A power-on circuit formed by a battery cell corresponding to the battery cell serial number is the target power-on circuit.

It should be noted that the present disclosure only exemplarily describes several implementations of obtaining the target power-on circuit. In an actual application process, an appropriate implementation may be selected based on an actual application environment.

Step S2: The generation module 132 calculates the theoretical charge capacity and the actual charge capacity of the battery cell in the target power-on circuit in a charging process or a discharging process.

The following describes a calculation process of the theoretical charge capacity $Q_i$ and the actual charge capacity $Q_{dis\_i}$ of the battery cell in the target power-on circuit in the discharging process.

The generation module 132 collects open circuit voltages of the battery cell in the target power-on circuit at a time interval. A period of time may be a time required by the battery cell in the target power-on circuit to be fully discharged from a fully charged state. For example, the generation module 132 collects an open circuit voltage $V_{i1}$ corresponding to the battery cell in the fully charged state in the target power-on circuit, and after the period of time, collects an open circuit voltage $V_{i2}$ corresponding to the battery cell in the fully discharged state in the target power-on circuit. Finally, $Q_i$ is calculated based on a charge capacity $Q_{i1}$ corresponding to $V_{i1}$ and a charge capacity $Q_{i2}$ corresponding to $V_{i2}$, where i is a battery cell serial number. For example, an open circuit voltage of a fifth battery cell in the battery pack in a fully charged state may be represented as $V_{51}$.

In step S2, there are various ways for the generation module 132 to calculate the theoretical charge capacity $Q_i$ of the battery cell in the target power-on circuit.

For example, after collecting $V_{i1}$ and $V_{i2}$, the generation module 132 may obtain $Q_{i1}$ and $Q_{i2}$ based on a correspondence between a charge capacity and an open circuit voltage of a battery cell. The correspondence between a charge capacity and an open circuit voltage may be represented by using Formula 1:

$$Q = a1 * V + b1$$

In the formula, Q indicates a charge capacity; V indicates an open circuit voltage; and a1 and b1 are constant parameters and can be set based on a service requirement or by a person skilled in the art based on experience. When the open circuit voltage of the battery cell in the target power-on circuit is $V_{i1}$, $Q_{i1}$ is calculated based on Formula 1. When the open circuit voltage of the battery cell in the target power-on circuit is $V_{i2}$, $Q_{i2}$ is calculated based on Formula 1.

In another example, after collecting $V_{i1}$ and $V_{i2}$, the generation module 132 may obtain $Q_{i1}$ and $Q_{i2}$ by reading a correspondence that is between a charge capacity and an open circuit voltage of a battery cell and that is pre-stored in a memory 133. The correspondence is obtained by performing a plurality of experimental fitting on the battery cell in an offline state. This experimental fitting manner is based on the conventional technology well-known to a person skilled in the art, and details are not described herein.

In another example, different states of charge may be obtained based on different open circuit voltages, and a charge capacity of the battery cell in the target power-on circuit may be further obtained based on a correspondence between a state of charge and a charge capacity.

There is a plurality of implementations for the generation module 132 to generate a state of charge corresponding to an open circuit voltage.

For example, a state of charge of a battery cell is obtained based on formula calculation. Specifically, the correspondence between an open circuit voltage and a state of charge may be represented by using Formula 2:

$$V=a2*SOC+b2$$

In the formula, V indicates an open circuit voltage; SOC indicates a state of charge; and a2 and b2 are constant parameters and can be set based on a service requirement or by a person skilled in the art based on experience. When the open circuit voltage of the battery cell in the target power-on circuit is $V_{i1}$, $SOC_{i1}$ is obtained by calculating based on Formula 2. When the open circuit voltage of the battery cell in the target power-on circuit is $V_{i2}$, $SOC_{i2}$ is obtained by calculating based on Formula 2.

In another example, the generation module 132 may obtain $SOC_{i1}$ and $SOC_{i2}$ by reading a correspondence that is between an open circuit voltage and a state of charge of a battery cell and that is pre-stored in the memory 133. The correspondence is obtained by performing experimental adjustment on the battery cell in an offline state. This experimental adjustment manner is based on the conventional technology well-known to a person skilled in the art, and details are not described herein.

There is a plurality of implementations for the generation module 132 to generate a charge capacity corresponding to a state of charge.

For example, after obtaining $SOC_{i1}$ and $SOC_{i2}$, the generation module 132 may obtain $Q_{i1}$ and $Q_{i2}$ based on a correspondence between a charge capacity and a state of charge of a battery cell. The correspondence between a charge capacity and a state of charge of a battery cell may be represented by using Formula 3:

$$Q=Q_{new}*SOC$$

In the formula, Q indicates a charge capacity; SOC indicates a state of charge; and $Q_{new}$ indicates a total charge capacity of a new battery. When the SOC of the battery cell in the target power-on circuit is $SOC_{i1}$, $Q_{i1}$ is obtained by calculating based on Formula 3. When the SOC of the battery cell in the target power-on circuit is $SOC_{i2}$, $Q_{i2}$ is obtained by calculating based on Formula 3.

In another example, after obtaining $SOC_{i1}$ and $SOC_{i2}$, the generation module 132 may obtain $Q_{i1}$ and $Q_{i2}$ by reading a correspondence that is between a charge capacity and a capacity status of a battery cell and that is pre-stored in a memory 133. The correspondence is obtained by performing a plurality of experimental fitting on the battery cell in an offline state. This experimental fitting manner is based on the conventional technology well-known to a person skilled in the art, and details are not described herein. The theoretical charge capacity $Q_i$ is obtained by calculating based on Formula 4:

$$Q_i=|Q_{i2}-Q_{i1}|$$

In step S2, there are various ways for the generation module 132 to calculate the actual charge capacity $Q_{dis\_i}$ of the battery cell in the target power-on circuit.

For example, the generation module 132 collects a current $I_{i1}$ corresponding to the battery cell in the fully charged state in the target power-on circuit; after a period of time, collects a current $I_{2i}$ corresponding to the battery cell in the fully discharged state in the target power-on circuit; and then performs an integral operation on $I_{i1}$ and $I_{2i}$ to obtain the actual charge capacity $Q_{dis\_i}$ of the battery cell in the target power-on circuit in the discharging process.

In another example, the generation module 132 collects an open circuit voltage $V_{i1}$ corresponding to the battery cell in the fully charged state in the target power-on circuit; after a period of time, collects an open circuit voltage $V_{2i}$, corresponding to the battery cell in the fully discharged state in the target power-on circuit; and then performs an integral operation on the $V_{i1}$ and $V_{2i}$ to obtain the actual charge capacity $Q_{dis\_i}$ of the battery cell in the target power-on circuit in the discharging process.

For a calculation process of the theoretical charge capacity and the actual charge capacity of the battery cell in the target power-on circuit in the charging process, refer to a generation manner of the theoretical charge capacity and the actual charge capacity of the battery cell in the target power-on circuit in the discharging process. Details are not described herein.

Step S3: The generation module 132 calculates an SOH of the battery cell in the target power-on circuit based on the theoretical charge capacity and the actual charge capacity.

The SOH may be calculated based on Formula 5:

$$SOH = \frac{Q_{dis\_i}}{Q_i}$$

In the formula, SOH indicates a state of health; $Q_{dis\_i}$ is the actual charge capacity of the battery cell in the target power-on circuit in the discharging process, and a unit is C; and $Q_i$ is the theoretical charge capacity of the battery cell in the target power-on circuit in the discharging process, and a unit is C.

For a calculation process of an SOH of the battery cell in the target power-on circuit in the charging process, refer to a calculation manner of the SOH of the battery cell in the target power-on circuit in the discharging process. Details are not described herein.

In conclusion, in this embodiment of the present disclosure, an aging state of the battery cell in the battery pack can be estimated. When the battery pack is unavailable (an SOH of the entire battery pack is less than or equal to 80%), an aging state of each battery cell in the battery pack is estimated by using the solution provided in the present disclosure. An obtained estimation result can provide a recycling guide for the battery cell in the battery pack, to improve secondary utilization of the battery cell in the battery pack.

Embodiment 2

Based on the technical solution provided in Embodiment 1, applicability of the solution provided in Embodiment 1 can be further improved, so that a state of health of a battery cell in a battery pack can be estimated without an external device. In this embodiment, a target power-on circuit may include a battery cell. An equalization resistor corresponding to the battery cell and an equalization switch corresponding to the battery cell are connected in series to form an equalization circuit. The equalization circuit is configured to implement a discharge function of the battery cell.

The obtaining module 131 in the embodiment provided in FIG. 3 may include a read submodule 1311 and a control submodule 1312. The generation module 132 may include a collection submodule 1321 and a data processing submodule 1322.

The following further describes a battery state of health estimation method in this embodiment with reference to FIG. 4. FIG. 4 is a schematic flowchart of a battery state of health estimation method according to an embodiment. The embodiment shown in FIG. 4 includes the following steps:

S11: Collect an initial open circuit voltage of a battery cell in a target power-on circuit, where the initial open circuit voltage is an open circuit voltage before the equalization switch is turned on.

The collection submodule 1321 collects the open circuit voltage of the battery cell in the target power-on circuit before the equalization switch is turned on. To help understand the context of the present disclosure, the open circuit voltage may be indicated by $V_{1i}$, where i indicates a battery cell serial number, and 1 indicates a start. A specific collection manner may be an implementation commonly used in the art, and details are not described herein.

S12: Control the equalization switch to turn on, so that the target power-on circuit is conducted.

A specific implementation may be as follows: The read submodule 1311 reads a battery cell serial number and a detection time carried in a detection instruction, and saves the battery cell serial number and the detection time in the memory 133. In the present disclosure, the detection time is less than or equal to a time required by the battery cell in the target power-on circuit to be fully discharged from a fully charged state. For example, a battery cell with a serial number 5 is the battery cell in the target power-on circuit, a time required for the battery cell with a serial number 5 to be fully discharged from a fully charged state is 180 min, and a detection time of the battery cell with a serial number 5 may be 90 min. In an actual application process, the detection time may be set based on a service requirement, or may be set by a person skilled in the art based on experience.

The control submodule 1312 invokes the battery cell serial number in the memory 133, and controls the target power-on circuit corresponding to the battery cell serial number to be conducted. In this case, the battery cell is in a discharging state.

In a process in which the target power-on circuit is conducted, the battery cell is discharged at a small current. Small current discharge can appropriately prolong an open circuit voltage discharge time of the battery cell. This can avoid, to some extent, a damage to the battery cell caused by a rapid drop of an open circuit voltage of the battery cell to below a cut-off discharge voltage.

S13: After the detection time, control the equalization switch to turn of.

A specific control manner may be an implementation commonly used in the art, and details are not described herein.

S1411: Collect an end open circuit voltage of the battery cell in the target power-on circuit, where the end open circuit voltage is an open circuit voltage when the equalization switch is turned of.

The collection submodule 1321 collects the open circuit voltage of the battery cell in the target power-on circuit when or after the equalization switch is turned off. To help understand the context of the present disclosure, the open circuit voltage may be indicated by $V_{2i}$, where i indicates a battery cell serial number, and 2 indicates an end. A specific collection manner may be an implementation commonly used in the art, and details are not described herein.

The collection submodule 1321 transmits $V_{1i}$ and $V_{2i}$ to the data processing submodule 1322.

S1412: Search a preset OCV-SOC table to obtain $SOC_{1i}$ and $SOC_{2i}$, where $SOC_{1i}$ is a state of charge corresponding to a new battery when an open circuit voltage is $V_{1i}$, and $SOC_{2i}$ is a state of charge corresponding to the new battery when an open circuit voltage is $V_{2i}$.

The preset OCV-SOC table is pre-stored in the memory 133, and the preset OCV-SOC table is used to record a correspondence between an open circuit voltage and a state of charge of a battery cell. The correspondence is obtained by performing experimental adjustment on the new battery cell in an offline state. This experimental adjustment manner is based on the conventional technology well-known to a person skilled in the art, and details are not described herein.

A specific searching manner may be an implementation commonly used in the art, and details are not described herein.

S1413: Calculate a theoretical charge capacity $Q_i$ of the battery cell in the target power-on circuit in a discharging process based on $SOC_{1i}$ and $SOC_{2i}$.

The theoretical charge capacity $Q_i$ of the battery cell in the target power-on circuit in the discharging process may be calculated based on Formula 6:

$$Q_i = (SOC_{1i} - SOC_{2i}) \times Q_{new}$$

In the formula, $Q_{new}$ is a total charge capacity of the new battery, and a unit is C.

S1421: Collect a real-time open circuit voltage of the battery cell in the target power-on circuit, where the real-time open circuit voltage is an open circuit voltage collected at a preset sampling frequency when the equalization switch is turned on.

The collection submodule 1321 collects, at the preset sampling frequency, open circuit voltages of the battery cell in the target power-on circuit during a period from when the equalization switch is turned on to when the equalization switch is turned off. To help understand the context of the present disclosure, the open circuit voltages may be indicated by $V_{i\_t}$, where i indicates a battery cell serial number, and t indicates a quantity of sampling times. A specific collection manner may be an implementation commonly used in the art, and details are not described herein.

S1422: Calculate an actual charge capacity of the battery cell in the target power-on circuit in the discharging process based on the real-time open circuit voltage.

In a feasible embodiment, to reduce a data processing amount of the data processing submodule 1322, Formula 7 may be used to calculate the actual charge capacity:

$$Q_{dis\_i} = \sum_{t=1}^{t=T \times 60 \times f} \frac{V_{i\_t}^2}{R \times f}$$

In the formula, $Q_{dis\_i}$ is the actual charge capacity, and a unit is C; T is a discharge time, and a unit is min; $V_{i\_t}$ is the real-time open circuit voltage, and a unit is V; R is a resistance value of the equalization resistor, and a unit is $\Omega$; and f is the preset sampling frequency, and a unit is Hz.

For example, a battery cell with a serial number 5 is the battery cell in the target power-on circuit, the preset sampling frequency is 50 Hz, the discharge time is 60 min, and the resistance value of the equalization resistor is $5\Omega$. With reference to Formula 7, the following is finally calculated:

15                                                                            16

$$Q_{dis\_5} = \sum_{t=1}^{t=5\times60\times50} \frac{V_{5\_t}^2}{5 \times 50}$$

Because a specific calculation process is based on the conventional technology well-known to a person skilled in the art, details are not described herein.

Step S15: The data processing submodule 1322 calculates an SOH of the battery cell in the target power-on circuit based on the theoretical charge capacity and the actual charge capacity.

The SOH of the battery cell in the target power-on circuit is calculated based on Formula 8:

$$SOH = k_i \times \frac{Q_{dis\_i}}{Q_i}$$

In the formula, $k_i$ is a mapping proportion coefficient, and $k_i$ is obtained by searching a preset $k_i$ table based on $V_{1i}$ and $V_{2i}$.

Figure 5:
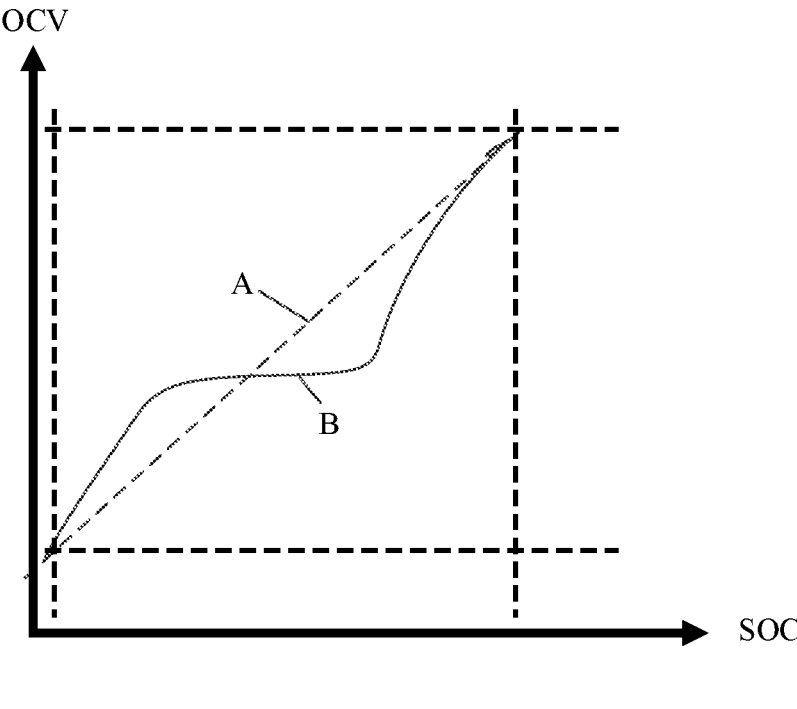
FIG. 5 is a schematic diagram of a correspondence between an open circuit voltage and a state of charge according to an embodiment of the present disclosure.

The state of health of the battery cell is affected by the theoretical charge capacity of the battery. The theoretical charge capacity is based on the SOC of the battery cell and is obtained based on the preset OCV-SOC table pre-stored in the memory 133. Usually, the preset OCV-SOC table is generated based on a linear relationship between an open circuit voltage and a state of charge. For details, refer to FIG. 5. FIG. 5 shows a correspondence between an open circuit voltage and a state of charge according to an embodiment. A curve A shows the correspondence linear relationship between an open circuit voltage and a state of charge that is recorded in the preset OCV-SOC table. It can be seen that V=a2*SOC+b2, where V indicates an open circuit voltage; SOC indicates a state of charge; and a2 and b2 are constant parameters and can be set based on a service requirement or by a person skilled in the art based on experience. A curve B shows a relationship between an open circuit voltage and a state of charge of a new battery. It can be seen that a relationship between an open circuit voltage and a state of charge of a new battery does not fully conform to the foregoing linear relationship. Based on this, in the present disclosure, the mapping proportion coefficient $k_i$ is introduced in a calculation process of the SOC, which can improve accuracy of an estimation result in this solution.

The data processing submodule 1322 may obtain a correspondence between $V_{1i}$ and $V_{2i}$ and a mapping proportion coefficient by reading the preset $k_i$ table pre-stored in the memory 133, so as to obtain $k_i$. Obtaining of the correspondence is based on the conventional technology well-known to a person skilled in the art, and details are not described herein.

An embodiment of the present disclosure further provides a computer storage medium. The computer storage medium includes computer instructions. When the computer instructions run on the foregoing electronic device, the electronic device is enabled to perform the functions or steps executed by the electronic device in the foregoing method embodiments.

An embodiment of the present disclosure further provides a computer program product. When the computer program product runs on a computer, the computer is enabled to perform the functions or steps executed by the electronic device in the foregoing method embodiments.

The foregoing descriptions about implementations allow a person skilled in the art to clearly understand that, for the purpose of convenient and brief description, division of the foregoing functional modules is used as an example for illustration. In actual application, the foregoing functions can be allocated to different modules and implemented based on a requirement, that is, an inner structure of an apparatus is divided into different functional modules to implement all or some of the functions described above.

It is easy to understand that, on the basis of the several embodiments provided in the present disclosure, a person skilled in the art can, for example, combine, split, and reorganize the embodiments of the present disclosure to obtain other embodiments, and none of these embodiments exceeds the protection scope of the present disclosure.

In the several embodiments provided in the present disclosure, it should be understood that the disclosed device and method may be implemented in other manners. For example, the described device embodiment is merely an example. For example, the module or division into the units is merely logical function division and may be other division in actual implementation. For example, a plurality of units or components may be combined or integrated into another apparatus, or some features may be ignored or not performed. In addition, the displayed or discussed mutual couplings or direct couplings or communication connections may be implemented through some interfaces. The indirect couplings or communication connections between the devices or units may be implemented in electronic, mechanical, or other forms.

The units described as separate parts may or may not be physically separate, and parts displayed as units may be one or more physical units, may be located in one place, or may be distributed on different places. Some or all of the units may be selected based on actual requirements to achieve the objectives of the solutions of embodiments.

In addition, functional units in embodiments of the present disclosure may be integrated into one processing unit, each of the units may exist alone physically, or two or more units may be integrated into one unit. The integrated unit may be implemented in a form of hardware, or may be implemented in a form of a software functional unit.

When the integrated unit is implemented in a form of a software functional unit and sold or used as an independent product, the integrated unit may be stored in a readable storage medium. Based on such an understanding, the technical solutions of embodiments of the present disclosure essentially, or the part contributing to the current technology, or all or some of the technical solutions may be implemented in a form of a software product. The software product is stored in a storage medium and includes several instructions for instructing a device (which may be a single-chip microcomputer, a chip, or the like) or a processor to perform all or some of steps of methods in embodiments of the present disclosure. The foregoing storage medium includes any medium that can store program code, such as a USB flash drive, a removable hard disk, a ROM, a RAM, a magnetic disk, or an optical disc.

The foregoing descriptions are merely specific implementations of the present disclosure, but are not intended to limit the protection scope of the present disclosure. Any variation or replacement within the technical scope disclosed in the present disclosure shall fall within the protection scope of the present disclosure. Therefore, the protection scope of the present disclosure shall be subject to the protection scope of the claims.

What is claimed is:

1. A battery state of health (SOH) estimation method comprising:

obtaining a target power-on circuit, wherein the target power-on circuit is a power-on circuit formed by a battery cell in a battery pack and a load or a charging device, wherein the target power-on circuit is an equalization circuit comprising the battery cell, an equalization resistor, and an equalization switch connected in series, and wherein the battery pack comprises a plurality of battery cells;

determining a theoretical charge capacity and an actual charge capacity of the battery cell in the target power-on circuit during a charging process or a discharging process, wherein determining the actual charge capacity of the battery cell in the target power-on circuit during the discharging process comprises:

collecting a real-time open circuit voltage of the battery cell in the target power-on circuit, wherein the real-time open circuit voltage is an open circuit voltage collected at a preset sampling frequency when the equalization switch is turned on; and determining the actual charge capacity of the battery cell based on a $V_{i_t}$, an R, and an f, wherein the $V_{i_t}$ is the real-time open circuit voltage in volts (V), the R is a resistance value in ohms ($\Omega$) of the equalization resistor, and the f is the preset sampling frequency in hertz (Hz), wherein a value of the t in $V_{i_t}$ is from 1 to T*60*f, and wherein the T is a discharge time in minutes;

determining an SOH of the battery cell based on the theoretical charge capacity and the actual charge capacity; and outputting the SOH of the battery cell to a display apparatus, wherein the SOH of the battery cell guides secondary utilization of the battery cell.

2. The battery SOH estimation method of claim 1, wherein determining the theoretical charge capacity of the battery cell in the target power-on circuit during the discharging process comprises:

collecting an initial open circuit voltage of the battery cell in the target power-on circuit, wherein the initial open circuit voltage is an open circuit voltage before the equalization switch is turned on;

controlling the equalization switch to turn on, so that the target power-on circuit is conducted;

controlling the equalization switch to turn off after a detection time;

collecting an end open circuit voltage of the battery cell in the target power-on circuit, wherein the end open circuit voltage is an open circuit voltage when the equalization switch is turned off;

searching a preset open circuit voltage (OCV)-state-of-charge (SoC) table to obtain an $SOC_{1i}$ and an $SOC_{2i}$, wherein the $SOC_{1i}$ is a first SOC corresponding to a new battery when an open circuit voltage is the initial open circuit voltage, and wherein the $SOC_{2i}$ is a second SOC corresponding to the new battery when the open circuit voltage is the end open circuit voltage; and determining the theoretical charge capacity of the battery cell in the target power-on circuit during the discharging process based on the $SOC_{1i}$ and the $SOC_{2i}$.

3. The battery SOH estimation method of claim 2, wherein the theoretical charge capacity of the battery cell in the target power-on circuit during the discharging process is determined based on a $Q_{new}$, the $SOC_{1i}$ and the $SOC_{2i}$, and wherein the $Q_{new}$ is a total charge capacity in coulombs (C) of the new battery.

4. The battery SOH estimation method of claim 2, wherein the detection time is less than or equal to a time required by the battery cell in the target power-on circuit to be fully discharged from a fully charged state.

5. The battery SOH estimation method of claim 2, wherein determining the actual charge capacity of the battery cell in the target power-on circuit during the discharging process comprises performing an integral operation on the initial open circuit voltage and the end open circuit voltage to obtain the actual charge capacity.

6. The battery SOH estimation method of claim 2, wherein the SOH of the battery cell of the target power-on circuit is determined based on a $k_i$, the theoretical charge capacity of the battery cell in the target power-on circuit in the discharging process, and the actual charge capacity of the battery cell in the target power-on circuit during the discharging process, and wherein the $k_i$ is a proportion coefficient obtained by searching a preset $k_i$ table based on the initial open circuit voltage and the end open circuit voltage.

7. The battery SOH estimation method of claim 6, wherein the preset OCV-SOC table records a correspondence between the open circuit voltage and an SOC, and wherein the preset $k_i$ table records a correspondence between the open circuit voltage and a proportion coefficient.

8. The battery SOH estimation method of claim 1, further comprising discharging the battery cell at a small current during the discharging process.

9. A battery management apparatus, comprising:

a memory configured to store instructions; and a processor coupled to the memory and configured to execute the instructions to cause the battery management apparatus to:

obtain a target power-on circuit, wherein the target power-on circuit is a power-on circuit formed by a battery cell in a battery pack and a load or a charging device, wherein the target power-on circuit is an equalization circuit comprising the battery cell, an equalization resistor, and an equalization switch connected in series, and wherein the battery pack comprises a plurality of battery cells;

determine a theoretical charge capacity and an actual charge capacity of the battery cell in the target power-on circuit during a charging process or a discharging process;

determine a state of health (SOH) of the battery cell based on the theoretical charge capacity and the actual charge capacity; and output the SOH of the battery cell to a display apparatus, wherein the SOH of the battery cell guides secondary utilization of the battery cell, and wherein the processor comprises a data processing subprocessor configured to determine the actual charge capacity of the battery cell in the target power-on circuit during the discharging process based on a $V_{i_t}$, an R, and an f, wherein the $V_{i_t}$ is a real-time open circuit voltage in volts (V), the R is a resistance value in ohms ($\Omega$) of the equalization resistor, and the f is a preset sampling frequency in hertz (Hz), and wherein a value of the t in $V_{i_t}$ is from 1 to T*60*f and the T is a discharge time in minutes.

10. The battery management apparatus of claim 9, wherein the processor comprises:

a collection sub-processor configured to collect an initial open circuit voltage and an end open circuit voltage of the battery cell in the target power-on circuit, wherein the initial open circuit voltage is an open circuit voltage before the equalization switch is turned on, and the end open circuit voltage is the open circuit voltage when the equalization switch is turned off; and a control sub-processor configured to control the equalization switch to turn on, so that the target power-on circuit is conducted, and to control the equalization switch to turn off after a detection time, and wherein the data processing sub-processor configured to;

search a preset open circuit voltage (OCV)-state-of-charge (SoC) table to obtain an $SOC_{1i}$ and an $SOC_{2i}$, wherein the $SOC_{1i}$ is a first state of charge corresponding to a new battery when an open circuit voltage is the initial open circuit voltage, and wherein the $SOC_{2i}$ is a second state of charge corresponding to the new battery when the open circuit voltage is the end open circuit voltage; and determine the theoretical charge capacity of the battery cell in the target power-on circuit during the discharging process based on the $SOC_{1i}$ and the $SOC_{2i}$.

11. The battery management apparatus of claim 10, wherein the data processing sub-processor is further configured to determine the theoretical charge capacity of the battery cell in the target power-on circuit during the discharging process based on a $Q_{new}$, the $SOC_{1i}$, and the $SOC_{2i}$, and wherein the $Q_{new}$ is a total charge capacity in coulombs (C) of the new battery.

12. The battery management apparatus of claim 10, wherein the detection time is less than or equal to a time required by the battery cell in the target power-on circuit to be fully discharged from a fully charged state.

13. The battery management apparatus of claim 10, wherein the data processing sub-processor is further configured to perform an integral operation on the initial open circuit voltage and the end open circuit voltage to obtain the actual charge capacity of the battery cell in the target power-on circuit during the discharging process.

14. The battery management apparatus of claim 10, wherein the collection sub-processor is further configured to collect the real-time open circuit voltage of the battery cell in the target power-on circuit, and wherein the real-time open circuit voltage is an open circuit voltage collected at the preset sampling frequency when the equalization switch is turned on.

15. The battery management apparatus of claim 10, wherein the preset OCV-SOC table records a correspondence between the open circuit voltage and an SOC, and wherein a preset $k_i$ table records a correspondence between the open circuit voltage and a proportion coefficient.

16. The battery management apparatus of claim 10, wherein the data processing sub-processor is further configured to discharge the battery cell at a small current.

17. A battery management system, comprising:

a battery control apparatus configured to:

receive a detection instruction from a host; and send the detection instruction to a battery management apparatus;

the battery management apparatus configured to:

receive the detection instruction from the battery control apparatus;

obtain a target power-on circuit based on the detection instruction, wherein the target power-on circuit is a power-on circuit formed by a battery cell in a battery pack and a load or a charging device, wherein the target power-on circuit is an equalization circuit comprising the battery cell, an equalization resistor, and an equalization switch connected in series, and wherein the battery pack comprises a plurality of battery cells;

determine a theoretical charge capacity and an actual charge capacity of the battery cell in the target power-on circuit in a charging process or a discharging process, wherein determining the actual charge capacity of the battery cell in the target power-on circuit during the discharging process comprises:

collecting a real-time open circuit voltage of the battery cell in the target power-on circuit, wherein the real-time open circuit voltage is an open circuit voltage collected at a preset sampling frequency when the equalization switch is turned on; and determining the actual charge capacity of the battery cell based on a $V_{i_t}$, an R, and an f, wherein the $V_{i_t}$ is the real-time open circuit voltage in volts (V), the R is a resistance value in ohms (Ω) of the equalization resistor, and the f is the preset sampling frequency in hertz (Hz), wherein a value of the t in $V_{i_t}$ is from 1 to T*60*f, and wherein the T is a discharge time in minutes;

determine a state of health (SOH) of the battery cell based on the theoretical charge capacity and the actual charge capacity; and output the SOH of the battery cell to a display apparatus, wherein the SOH of the battery cell guides secondary utilization of the battery cell.

18. The battery management system of claim 17, wherein the battery management apparatus is further configured to determine the theoretical charge capacity of the battery cell in the target power-on circuit during the discharging process by:

collecting an initial open circuit voltage of the battery cell in the target power-on circuit, wherein the initial open circuit voltage is an open circuit voltage before the equalization switch is turned on;

controlling the equalization switch to turn on, so that the target power-on circuit is conducted;

controlling the equalization switch to turn off after a detection time;

collecting an end open circuit voltage of the battery cell in the target power-on circuit, wherein the end open circuit voltage is an open circuit voltage when the equalization switch is turned off;

searching a preset open circuit voltage (OCV)-state-of-charge (SoC) table to obtain an $SOC_{1i}$ and an $SOC_{2i}$, wherein the $SOC_{1i}$ is a first SOC corresponding to a new battery when an open circuit voltage is the initial open circuit voltage, and wherein the $SOC_{2i}$ is a second SOC corresponding to the new battery when the open circuit voltage is the end open circuit voltage; and determining the theoretical charge capacity of the battery cell in the target power-on circuit during the discharging process based on the $SOC_{1i}$ and the $SOC_{2i}$.

19. The battery management system of claim 18, wherein the theoretical charge capacity of the battery cell in the target power-on circuit during the discharging process is determined based on a $Q_{new}$, the $SOC_{1i}$ and the $SOC_{2i}$, and wherein the $Q_{new}$ is a total charge capacity in coulombs (C) of the new battery.

20. The battery management system of claim 19, wherein the detection time is less than or equal to a time required by the battery cell in the target power-on circuit to be fully discharged from a fully charged state.

\* \* \* \* \*